United States Patent [19]

Minks

[11] Patent Number: 4,904,961

[45] Date of Patent: Feb. 27, 1990

[54] CONTROL CIRCUIT FOR BLOCKING OSCILLATOR

[76] Inventor: Floyd M. Minks, 2700 Partin Settlement Rd., Kississimee, Fla. 32743

[21] Appl. No.: 351,970

[22] Filed: May 15, 1989

Related U.S. Application Data

[62] Division of Ser. No. 70,234, Jul. 6, 1987, Pat. No. 4,829,971, Division of Ser. No. 791,764, Oct. 28, 1985, Pat. No. 4,705,013.

[51] Int. Cl.[4] .......................................... H03K 3/354

[52] U.S. Cl. .............................. 331/112; 315/209 T; 123/598

[58] Field of Search ............... 331/112, 146, 147, 148, 331/149; 315/209 T, 209 CD, 209 SC; 123/598

[56] References Cited

U.S. PATENT DOCUMENTS 3,302,130 1/1967 Minks ................................ 331/112

*Primary Examiner*—Siegfried H. Grimm

*Attorney, Agent, or Firm*—Duckworth, Allen, Dyer & Doppelt

[57] ABSTRACT

This invention relates to a blocking oscillating converter for transferring energy from a source of power, such as a vehicle battery, to a storage means, such as an energy storage capacitor in a capacitor discharge ignition system. A novel control and feedback circuit incorporated in the blocking oscillator allows the drive level to the switching transistor to be controlled in response to the peak current in said transistor as well as the output voltage of the blocking oscillator. Furthermore the control circuit allows the blocking oscillator to be turned off during the short period of time after each spark discharge that is needed for turnoff of a switching device used to control that discharge.

7 Claims, 1 Drawing Sheet

CONTROL CIRCUIT FOR BLOCKING OSCILLATOR

This is a division of application Ser. No. 070,234, filed Jul. 6, 1987, now U.S. Pat. No. 4,829,971, which is a division of application Ser. No. 791,764, filed Oct. 28, 1985 and now U.S. Pat. No. 4,705,013.

This invention relates to an electronic ignition for producing sparks for ignition in an engine. This invention contains a blocking oscillator including a novel control circuit for efficiently supplying and controlling power to an energy storage capacitor or other load over widely varying operating conditions.

BACKGROUND OF THE INVENTION

Blocking oscillator converters have been used for transferring energy from a vehicle battery to the capacitive storage means in ignition systems because of the capability of high efficiency in this type of converter. Various means have been used to control the power output of the converter such as that shown in applicant's U.S. Pat. No. 3,395,686 which effectively regulates the volt time integral to the converter primary winding to a level selected to charge the energy storage capacitor in a single cycle. This effectively controls not only the voltage on the capacitor, but allows time for the output switching SCR to return to the off state because of the relatively low frequency of the converter. This type of circuitry, however, has the disadvantage that the converter transformer must be relatively large to store the entire required energy in one cycle and thus heavy and expensive. Applicant's U.S. Pat. No. 3,302,130 shows a means of controlling the output voltage of the blocking oscillator by sensing that voltage as reflected to another winding on the oscillator transformer and thus controlling the drive to the blocking oscillator switching transistor. However, the frequency is still limited by the turnoff characteristics of the output SCR and efficiency and capability of operating over a wide range of input voltages are limited by dissipation in the drive circuit of the converter switching transistor.

While the teaching of the previous patents just mentioned have resulted in satisfactory solid state ignition systems, they have not been applied to some applications because of size, weight, or cost.

It is an object of this invention is to produce a solid state ignition system containing a converter operating at a frequency high compared to the required output spark repetition rate and with feedback control to minimize output variations resulting from input voltage variations or engine speed.

It is a further object of this invention to allow the converter to be gated off for a period of time following each output spark to allow the output switching device to turn off.

It is a still further object of this invention to produce a DC to DC converter capable of operating efficiently over a wide range of input and/or output voltages and which is very insensitive to the characteristics of the active devices used therein, which characteristics may change from device to device or with temperature.

THE SUMMARY OF THE INVENTION

This invention relates to a blocking oscillating converter for transferring energy from a source of power, such as a vehicle battery, to a storage means, such as an energy storage capacitor in a capacitor discharge ignition system. A novel control and feedback circuit incorporated in the blocking oscillator allows the drive level to the switching transistor to be controlled in response to the peak current in said transistor as well as the output voltage of the blocking oscillator. This control and feedback circuit includes a current shunt that senses instantaneous current in the blocking oscillator inductor. The output of this shunt is used to control the peak input current by establishing a shunt path around the input terminals of said switching transistor. This path around the input terminals is also made responsive to other circuit conditions such as output voltage. Furthermore the control circuit allows the blocking oscillator to be turned off during the short period of time after each spark discharge that is needed for turnoff of a switching device used to control that discharge.

DESCRIPTION OF THE DRAWINGS

The above and other objects, features and advantages will become apparent from the following detailed description taken in conjunction with the accompanying drawing in which.

DETAILED DESCRIPTION OF PREFERRED EMBODIMENT

Figure 1:
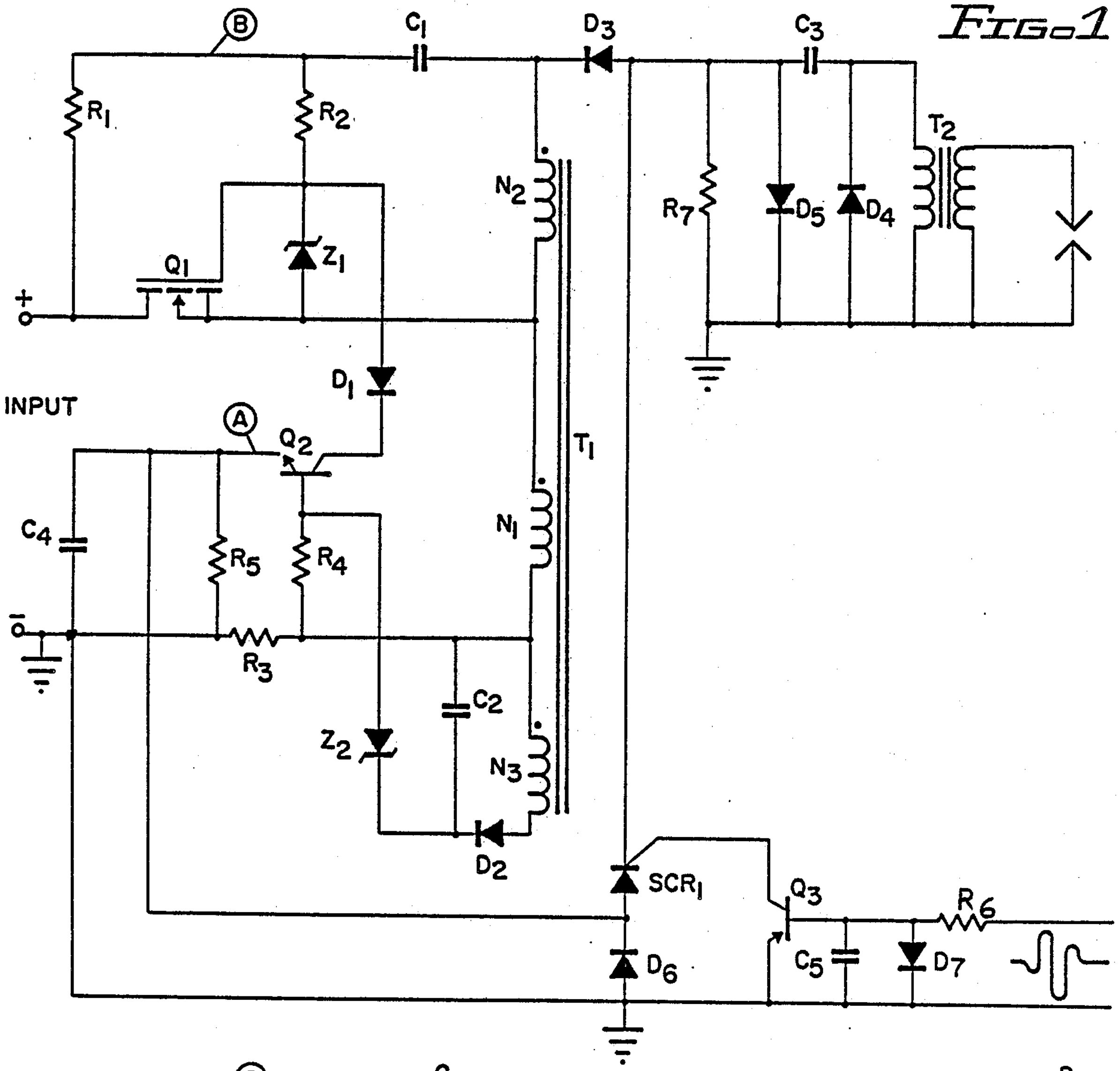
FIG. 1 is a circuit diagram of an energy discharge system containing a regulated blocking oscillator.

FIG. 1 is a schematic type diagram of a preferred form of the present invention. The function of SCR1, D4, D5, C3, and T2 including the energy storage capacitor, output transformer and associated switching device (shown as an SCR) and protective diodes are similar to applicant's U.S. Pat. No. 3,369,151 and 3,395,686 referred to above and will not be further described here. Transistor Q3 allows the output of a timing device, such as shown in applicant's U.S. Pat. No. 3,851,198 and most easily constructed with one terminal grounded, to provide the required gate drive to SCR1 to produce the output pulse at the selected time. Capacitor C5 along with diode D7 and resistor R6 protect the base emitter junction of transistor Q3 from high voltage transients which might undesirably be coupled to the timing input lead and also prevent the firing of the ignition system in response to short duration electrical noise. Diode D6, capacitor C4 and resistor R5 are connected in parallel with each other and in series with the discharge of the energy storage capacitor C3, by SCR1, into the primary of the spark transformer T2. A voltage equivalent to the forward voltage drop of diode D6 will thus appear across these three components when SCR1 is conducting and after conduction ceases will continue to appear as an exponential decay determined, as is known, by the time constant of capacitor C4 and resistor R5. Thus these components may be specified so that a feedback signal can be derived across them, that is from point A to ground. The presence of this feedback signal will indicate SCR1 is either still turned on or has not been turned off for a sufficient time to guarantee that it has recovered blocking capability. However, at times considerably longer than the C4, R5 time constant after the production of a spark output, the parallel combination of C4 and R5 have very low impedances to short duration low current pulses produced, as will presently be described, or by the control circuit in the converter. In applications of this invention where the turnoff of SCR1 is not a problem as it interacts with the converter, (such as when high holding current devices are used for SCR1) the anode of SCR1 and also the emitter of transistor Q2 may be connected directly to ground. Transformer T1 must have some characteristics normally associated with an inductor as well as a transformer. These characteristics include tight coupling between windings. Winding polarities are shown by the dots in FIG. 1. Inductive characteristics required are a preselected value of inductance and minimum loss associated with that inductance. This can easily be accomplished by use of a ferrite core material with a preselected air gap inserted between the sections of the core. Transistor Q1 is used to selectively connect winding N1 in series with a source of input power, allowing energy to be stored in the magnetic field of T1. When the desired amount of energy is stored, (which is expressed by the function $J=1/2LI^2$, and therefore is a unique function of the current for any given value of inductance) transistor Q1 is rapidly switched from the saturated on to the off state so that the energy stored in the magnetic field associated with T1 will be transferred through diode D3 to the energy of storage capacitor C3. Transistor Q1 is shown as an N channel enhancement mode field effect transistor, which is particularly well suited to this type of application. However, other devices capable of amplifying electrical signals could be substituted. The path for the major portion of the current from the input terminals is thus from the drain to the source of Q1 through winding N1 and through resistor R3 to ground and the negative terminal of the input supply. Resistor R3 is of a low value and serves, as will be described, as a current shunt. The internal resistance of winding N1 could serve as R3 if a fourth winding not shown, and of the same number of turns as N1, was used to cancel out the AC voltage. The voltage across R3 is used to control the current level at which Q1 is switched off. Zener diode Z1 is connected from the gate to source terminals of transistor Q1 and has an avalanche voltage somewhat below the maximum safe gate source voltage for this device. Thus, Z1 protects the gate source junction from excessive voltages while still allowing sufficient voltage to saturate Q1 in the on direction. Also, since Z1 can conduct from its anode to its cathode, it prevents the application of significant voltage in the reverse direction to this junction and permits a path for current to flow in that direction. Resistor R1 supplies a small bias current to the circuit point, reference letter B, which is required for initial starting of the converter. Upon initial connection of the input this current can not indefinitely charge capacitor C1 and thus in the absence of an AC drive signal will pass through resistor R2 and bias transistor Q1 to allow current to flow from drain to the source. Normally R1 would be a very high value compared to resistor R2. Thus, when sufficient voltage is available at the gate of Q1, it will enter the active region and current will flow through N1 as previously described. It can be seen from polarity marks on windings N1 and N2, that any upward fluctuation or noise in this current will produce a voltage at that top end of N2 which will be coupled through C1 and R2 to the gate of Q1 in phase to further turn on Q1. Q1 will thus regeneratively and rapidly enter saturation with the major portion of the input voltage then applied across winding N1. The current in N1 will then begin to increase as a ramp function with time. When the current produces a voltage drop across R3 that is equivalent to the turn-on or base emitter saturation voltage of the amplifying device Q2, it is turned on. Q2 is shown as a bi-polar transistor. This voltage would be approximately 0.6 volt for a typical, small signal silicon bi-polar transistor. Thus, transistor Q2 will begin to conduct current from it's collector to emitter terminals. This current will flow through D1 and must be large enough to produce a voltage drop across R2 as high as the input voltage multiplied by the $N_2/N_1$ turns ratio and also must rapidly discharge the capacitance associated with the input of Q1. Thus Q1 will begin to turn off. The turn off of Q1 will be more rapid than with resistor feedback coupling circuits previously associated with blocking oscillators because the potential existing across C1 just prior to turn off will be of such polarity as to aid in turning off transistor Q1. Forward conduction through Z1 will prevent reverse voltage damage to the gate of Q1. The interaction of capacitor C1 with diode D1 and/or zener Z1 is quite similar to a voltage doubler circuit, the operation of which is well known and will not be further described herein. The use of a capacitor as a coupling between point B and the transformer winding N2 allows starting of the oscillator at relatively low input voltages even with very high resistances used for resistor R1, thus minimizing the physical size of R1 and the losses therein. Thus, as just described, and in the absence of voltages across resistor R4 or from point A to ground that are significant compared to the base emitter saturation voltage of Q2, Q1 will again be turned on and another cycle initiated as soon as the energy associated with the magnetic field of transformer T1 has been transferred through diode D3 to the capacitor C3 or other load. Resistor R7 is a bleeder resistor to prevent capacitor C3 from remaining charged for long periods of time after removal of the input voltage. Resistors R4 and R5 are sufficiently low that the voltage drops across them, associated with the transistor Q2 base and emitter current necessary to terminate each current ramp through transistor Q1, in response to the selected current level monitored as a voltage drop across R3, are insignificant.

Thus each cycle the converter will contribute to an increasing charge on capacitor C3, and the voltage across windings N1, N2, and N3 will also go to a higher level during the portion of each succeeding cycle while transistor Q1 is off and energy is being transferred. Thus, because of the tight coupling between the windings of T1, capacitor C2 will be charge, through diode D2, to a voltage proportional to that voltage on the output, in this case, capacitor C3. Normally the number of turns on winding N3 would be lower and therefore the voltage lower on capacitor C2 than at the output on capacitor C3. This ratio and the value of zener diode Z2 would be chosen so that when the desired full charge is reached on capacitor C3, capacitor C2 is charged to the avalanche voltage of Z2. Thus, any attempt at further increase in the voltage on capacitor C3 and in turn C2, will produce a voltage drop across R4. C2 need only be large enough that this voltage drop is essentially constant throughout a given cycle of the converter. Any avalanche current through Z2 produces a voltage drop across R4 of the polarity to turn on transistor Q2, and thus will reduce the required voltage drop across shunt R3 when turn off of transistor Q2 is initiated. Thus the average power input to the converter will be reduced to a level just sufficient to maintain the desired output voltage or charge on capacitor C3, where it will remain until an input trigger pulse initiates a discharge of capacitor C3 by SCR1 to produce the desired output spark. The converter will then return to its selected high power level until capacitor C3 is again charged to the desired level.

Under essentially no output load conditions, the component values for the circuit can be selected by one skilled in the art so that transistor Q2 so completely discharges or reduces the charge on capacitor C1 and the capacity associated with the input of Q1, that rather than simply decreasing the peak current through transistor Q1 on each cycle, (incidentally raising the frequency of operation of the converter) the turn on of Q1 immediately after the transfer of energy from the inductive field associated with T1 to the load is prevented. Distributed capacity and leakage inductance associated with the windings of T1 also effect this operating mode. Thus, Q1 remains off for additional time associated primarily with the time for sufficient charge to flow through resistor R1 to charge C1 and the input capacitance of Q1 to the threshold or turn on voltage of transistor Q1. Operation of the converter in this mode can result in extremely low average input powers in the order of 0.001 times the input power under conditions from maximum power load to the output. It can be also seen that any reverse charging of capacitor C3 (such as from the leakage inductance associated with transformer T1 and not completely bypassed by the diode D5) will produce a current through diode D3 and windings N1 and N2 and resistor R3 to ground. This current would also be of the polarity to turn/on transistor Q2 thus preventing the turn/on of transistor Q1 or to turn transisitor Q1 off if it is already in the saturated on state. As has been previously described, the discharge path of capacitor C3 is through the primary of T1, D6, and SCR1. With the voltages generally used in the energy storage capacitors of solid state ignitions, the power dissipation in D6 will be sufficiently low to have negligible effect on the output of the system. However, the voltage drop across D6 appearing at point A will turn on transistor Q2 and thus cause an interruption in the oscillations of the converter circuit until the current through Diode D6 and thus SCR1 has reached zero. Converter operation may be interrupted for an additional time selected by the value of capacitor C4 and resistor R5 and, if desired, for a longer time as previously described, by selecting the value of R1 as it interacts with capacitor C1 and the capacity associated with the input to transistor Q1.

Figure 2:
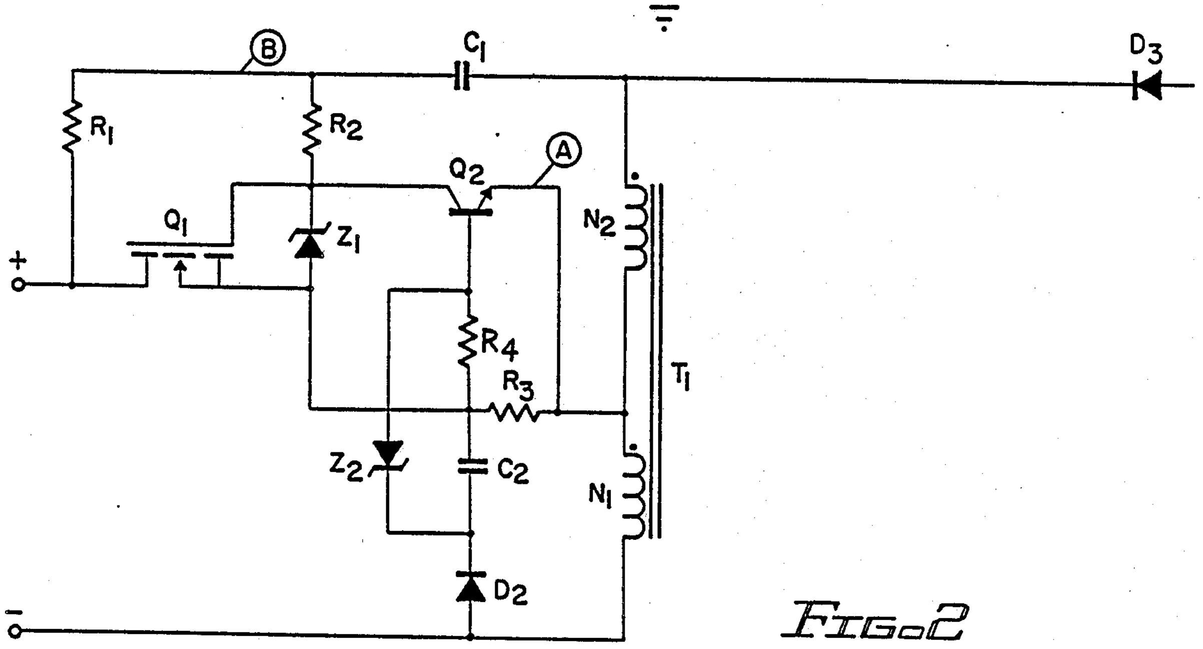
FIG. 2 is a circuit diagram of a simplified version of the oscillator which forms a portion of FIG. 1.

FIG. 2 shows a simplified version of a converter circuit of this invention, advantageously used in applications where other circuit parameters are such that the interruption of converter operation is not necessary to insure the turnoff of a switching device such as SCR1. Thus, point A is returned directly to the negative side of resistor R3. Also R3 is shown in FIG. 2 between the source terminal of transistor Q1 and the common point of windings N1 and N2. In this location R3 still senses essentially the same current and thus functions the same as previously described. It should be noted that in this location winding N1 is of the polarity to serve the function previously served by N3 which thus may be omitted if the voltage levels across N1 are compatible with reasonable components for Z2 as shown, otherwise, winding N3 could be retained and thus have a common point with the junction of winding N1 and N2. A resistor, not shown, can be added from the junction of capacitor C1 and winding N2 to the base of transistor Q2 to reduce variations in maximum converter power levels when the input voltage varies over extremely wide ranges. The anode of diode D3 connects the converter to a load such as that, for example, shown in FIG. 1. An additional winding could be added to T1 and for applications requiring high voltage outputs could be connected in series with N1 and N2. Also a load could be connected to the common point between N1 and N2. D3 would be moved or additional diodes added between T1 and the load or loads. Also, two separate windings could advantageously be connected through separate diodes to a single load to minimize transients from imperfect coupling between windings. Many of the unique characteristics of the converter circuit of this invention can be advantageously applied to regulated converter applications other than spark discharge circuits by one skilled in the art.

While the invention has been described in what is presently considered to be a preferred embodiment, many modifications will become apparent to those skilled in the art. It is intended, therefore, by the appended claims to cover all such modifications as fall within the true spirit and scope of the invention.

What is claimed is:

1. A blocking oscillator for supplying energy from a source of electrical power to a load comprising an electronic switching device with an input terminal, an output terminal, and a common input-output terminal, an inductor, a resistive shunt, said output terminal and said common input-output terminal effectively connected in series with said resistive shunt and said inductor to terminals for receiving power from said source of electrical power, a feedback circuit responsive to voltage across said inductor to supply voltage between said input terminal and said common input-output terminal to turn on said electronic switching device, said feedback circuit containing a feedback control device, said feedback control device being responsive to the voltage across said resistive shunt.

2. The blocking oscillator of claim 1 wherein said feedback control device has an input terminal, an output terminal, and a common input-output terminal, said feedback control device connected to interrupt said feedback circuit.

3. The blocking oscillator of claim 2 wherein the output terminal and common input-output terminal of said feedback control device are effectively connected across the input terminal and common input-output terminal of said electronic switching device.

4. The blocking oscillator of claim 2 wherein the input terminal and common input-output terminal of said feedback control device is connected to receive a signal from said resistive shunt to turn off said electronic switching device.

5. The blocking oscillator of claim 4 wherein said feedback control device is also connected to receive a signal from the voltage across said inductor during a selected portion of each cycle of said blocking oscillator.

6. The blocking oscillator of claim 1 wherein a capacitor is connected in series in said feedback circuit.

7. The blocking oscillator of claim 6 wherein said electronic switching device is a field effect transistor.

* * * * *